(12) United States Patent
Lytle

(10) Patent No.: US 7,820,485 B2
(45) Date of Patent: Oct. 26, 2010

(54) METHOD OF FORMING A PACKAGE WITH EXPOSED COMPONENT SURFACES

(75) Inventor: William H. Lytle, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 12/240,513

(22) Filed: Sep. 29, 2008

(65) Prior Publication Data

US 2010/0081234 A1    Apr. 1, 2010

(51) Int. Cl.
*H01L 21/00* (2006.01)
(52) U.S. Cl. ............... 438/110; 257/E21.502
(58) Field of Classification Search ......... 438/106–107, 438/109–110, 127; 257/E21.502
See application file for complete search history.

(56) References Cited

U.S. PATENT DOCUMENTS

| | | | |
|---|---|---|---|
| 3,858,150 A | 12/1974 | Gurtler et al. | |
| 4,317,126 A | 2/1982 | Gragg, Jr. | |
| 4,617,606 A | 10/1986 | Shak et al. | |
| 5,353,498 A | 10/1994 | Fillion et al. | |
| 5,635,010 A | 6/1997 | Pepe et al. | |
| 5,866,952 A | 2/1999 | Wojnarowski et al. | |
| 5,889,211 A | 3/1999 | Maudie et al. | |
| 5,991,185 A | 11/1999 | Hachiya | |
| 6,310,606 B1 | 10/2001 | Armstrong | |
| 6,407,456 B1 | 6/2002 | Ball | |
| 6,772,510 B1 | 8/2004 | Corisis | |
| 6,806,593 B2 | 10/2004 | Tai et al. | |
| 6,838,776 B2 | 1/2005 | Leal et al. | |
| 6,924,551 B2 | 8/2005 | Rumer et al. | |
| 6,958,261 B2 | 10/2005 | Chow et al. | |
| 6,964,889 B2 | 11/2005 | Ma et al. | |
| 7,009,124 B2 | 3/2006 | Chen et al. | |
| 7,045,868 B2 | 5/2006 | Ding et al. | |
| 7,074,647 B2 | 7/2006 | Owens et al. | |
| 7,111,149 B2 | 9/2006 | Eilert | |
| 7,166,495 B2 | 1/2007 | Ball | |
| 7,189,596 B1 | 3/2007 | Mu et al. | |
| 7,202,140 B1 | 4/2007 | Ang et al. | |
| 7,241,641 B2 | 7/2007 | Savastiouk et al. | |
| 7,425,464 B2 * | 9/2008 | Fay et al. ................ | 438/107 |
| 2003/0230798 A1 * | 12/2003 | Lin et al. ................ | 257/704 |
| 2005/0062173 A1 | 3/2005 | Vu et al. | |
| 2006/0118933 A1 | 6/2006 | Haba | |

(Continued)

OTHER PUBLICATIONS

U.S. Appl. No. 12/240,509, filed Sep. 29, 2008, entitled Packaging Having Two Devices and Method of Forming Thereof, first-named inventor, Kenneth R. Burch.

(Continued)

*Primary Examiner*—W. David Coleman
*Assistant Examiner*—Christine Enad
(74) *Attorney, Agent, or Firm*—Kim-Marie Vo

(57) ABSTRACT

A method of forming a semiconductor package includes forming a coating over a first device, attaching the first device to a substrate using an adhesive, encapsulating the first device using an encapsulant material, releasing the first device from the substrate using the adhesive, removing a portion of the encapsulant material that is over the first device to expose the coating, and removing the coating over the first device to expose a portion of the first device.

17 Claims, 4 Drawing Sheets

U.S. PATENT DOCUMENTS

| | | | |
|---|---|---|---|
| 2007/0045875 A1* | 3/2007 | Farnworth et al. | 257/787 |
| 2007/0085177 A1 | 4/2007 | Loo et al. | |
| 2009/0057885 A1* | 3/2009 | Theuss | 257/723 |
| 2009/0079090 A1* | 3/2009 | Pressel et al. | 257/777 |
| 2009/0176348 A1* | 7/2009 | Griffiths | 438/458 |

OTHER PUBLICATIONS

U.S. Appl. No. 11/846,874, filed Aug. 29, 2007, entitled Interconnect in a Multi-Element Package, first-named inventor Tang, Jinbang, et al.

U.S. Appl. No. 11/831,654, filed Jul. 31, 2007, entitled Redistributed Chip Packaging with Thermal Contact to Device Backside, first-named inventor Tracht, Neil T., et al.

U.S. Appl. No. 11/371,658, filed Mar. 8, 2006, entitled Method for Planarizing Vias Formed in a Substrate, first-named inventor Amrine, Craig, et al.

U.S. Appl. No. 11/561,063, filed Nov. 17, 2006, entitled Method of Packaging a Semiconductor Device and a Prefabricated Connector, first-named inventor Mangrum, Marc A.

U.S. Appl. No. 11/561,234, filed Nov. 17, 2006, entitled Method of Packaging a Device Having a Multi-Contact Elastomer Connector Contact Area and Device Thereof, first-named inventor Mangrum, Marc A.

U.S. Appl. No. 11/561,232, filed Nov. 17, 2006, entitled Method of Packaging a Device Having a Tangible Element and Device Thereof, first-named inventor Mangrum, Marc A.

U.S. Appl. No. 11/561,211, filed Nov. 17, 2006, entitled Method of Packaging a Device Having a Keypad Switch Point, first-named inventor Burch, Kenneth R.

U.S. Appl. No. 11/561,241, filed Nov. 17, 2006, entitled Method of Packaging a Device Using a Dielectric Layer, first-named inventor Mangrum, Marc A.

STATSChipPac, Fan-in PoP, www.statschippac.com, Mar. 2010.

Pendse, Raj, Ph.D., "fcPiP: The Marriage of Flip Chip and Wire Bond", STATS ChipPAC, Inc., Advanced Packaging, Oct. 2008.

* cited by examiner

METHOD OF FORMING A PACKAGE WITH EXPOSED COMPONENT SURFACES

BACKGROUND

1. Field

This disclosure relates generally to a method of forming a semiconductor package, and more specifically, to a method of forming a semiconductor packaging having an exposed surface of a device.

2. Related Art

Customers desire smaller and smarter electronic products. To meet customer desires, devices that have cavities, such as pressure sensors, need to be packaged. Sensors, can be packaged in various packages, such as a ceramic leadless chip carrier, a wafer level package, or a quad-flat package (QFP). However, these packages have large package form factors, are expensive or, if used to package a sensor, result in a poor quality sensor.

In addition, customer's desire for smarter electronic products require different device in one package. For example, a sensor can be combined with a microcontroller for tire pressure monitoring in an automobile. Such an integrated system can decrease cost and cycle time for development of the end-product. (e.g., the automobile).

Hence, a need exists for an improved package that is cost-effective and can be used for packaged device with a cavity, such as a sensor.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In accordance with one embodiment, components or devices are prepared using a protective film, such as a releasable tape. The components are then singulated and attached to a die attach, such as a tape. Additional devices or other components may also be attached. The components and any additional devices or components are encapsulated. A portion of the encapsulant is then removed to expose the protective film, which is subsequently released.

Figure 1:
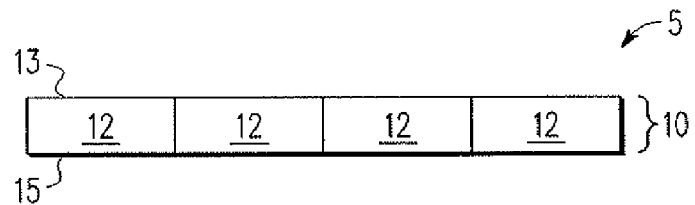
FIG. 1 illustrates a cross-section of a portion of a first device array in accordance with an embodiment.

FIG. 1 illustrates a cross-section of a portion of a first device array 5 in accordance with an embodiment. The first device array 5 may be a semiconductor wafer 10 that includes first devices 12. Each of the first devices 12 has a first surface 13 and a second surface 15, which is parallel to an opposite the first surface 13. In one embodiment, the first surface 13 is the active surface because electrical terminals, such as bond pads, are exposed on the first surface 13. The semiconductor wafer 10 may be any semiconductor material or combinations of materials, such as gallium arsenide, silicon germanium, silicon-on-insulator (SOI), silicon, monocrystalline silicon, the like, and combinations of the above. The first devices 12 may any type of device or integrated circuit, such as a microcontroller, microprocessor, a memory device, the like, or combinations of the above.

Figure 2:
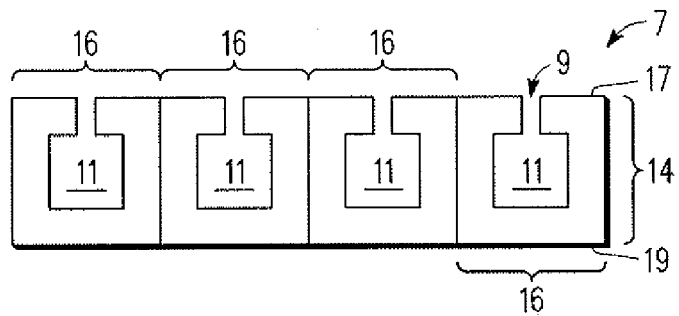
FIG. 2 illustrates a cross-section of a portion of a second device array in accordance with an embodiment.

FIG. 2 illustrates a cross-section of a portion of a second device array 7 in accordance with an embodiment. The second device array 7 includes second devices 16. In one embodiment, the second devices 16 are cavity devices (i.e., devices having at least one cavity). For example, the second devices 16 may be pressure sensors, microphones, accelerometers, the like, or combinations of the above. Each of the second devices 16 have a first surface 17 or side and a second surface or side 19, which is opposite and parallel to the first surface 17. In on embodiment, the first surface 17 has an opening 9 to a cavity 11.

Figure 3:
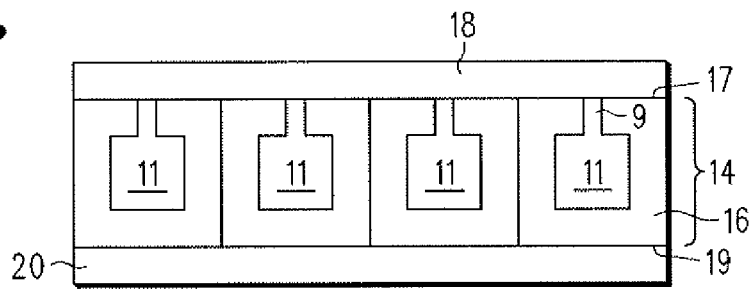
FIG. 3 illustrates the second device array of FIG. 2 after applying first and second coatings in accordance with an embodiment.

FIG. 3 illustrates the second device array 7 of FIG. 2 after applying first and second coatings or protective layers in accordance with an embodiment. In one embodiment, a sacrificial coating 18 is applied over the first surface 17 to cover the opening 9 of each of the second devices 16. The sacrificial coating 18 may be a self-supporting coating, such as a tape. One example of a suitable material is a spun-on soluble resist that can be released during subsequent processing. For example, the first coating 18, a sacrificial coating, may be thermal, low tack, or ultraviolet (UV) tape. As will be understood after further discussion, the sacrificial coating 18 protects the cavity 11 during processing. A second coating 20 may also be applied to the second device array 14. The second coating 20 may be used to protect the second surface 19 during processing. For example, the second coating 20 is desirable if the second device 16 is a pressure sensor because the second surface 19 would be the active side membrane. As will be better understood after further explanation, in subsequent processing the membrane could be destroyed if the second coating 20 was not present. In one embodiment, the second coating 20 is not present.

Figure 4:
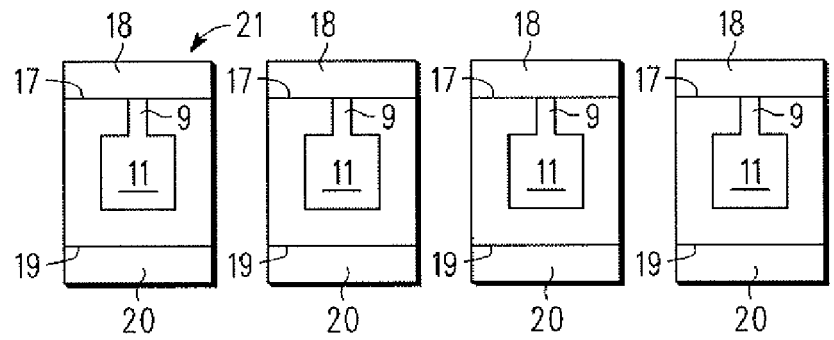
FIG. 4 illustrates the second device array of FIG. 3 singulated in second devices in accordance with an embodiment.

After applying the first coating 18 and if applicable, the second coating 20, the second device array 16 is singulated, as illustrated in FIG. 4, into coated second devices 21. Singulation can be performed by laser, sawing, the like, or combinations of the above.

Figure 5:
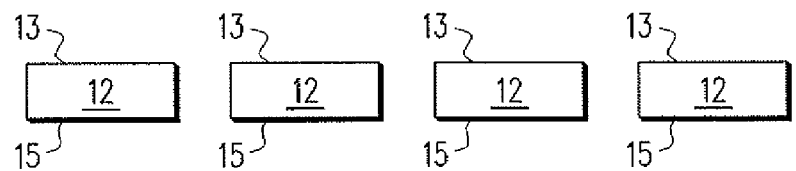
FIG. 5 illustrates the first device array of FIG. 1 singulated into first devices in accordance with an embodiment.

FIG. 5 illustrates the first device array 10 of FIG. 1 singulated into first devices 12 in accordance with an embodiment. The first device array 10 can be singulated using a laser, a saw, the like or combinations of the above. The singulation of the first device array can be performed at any time (e.g., before or after the second device array 14 is singulated.)

Figure 6:
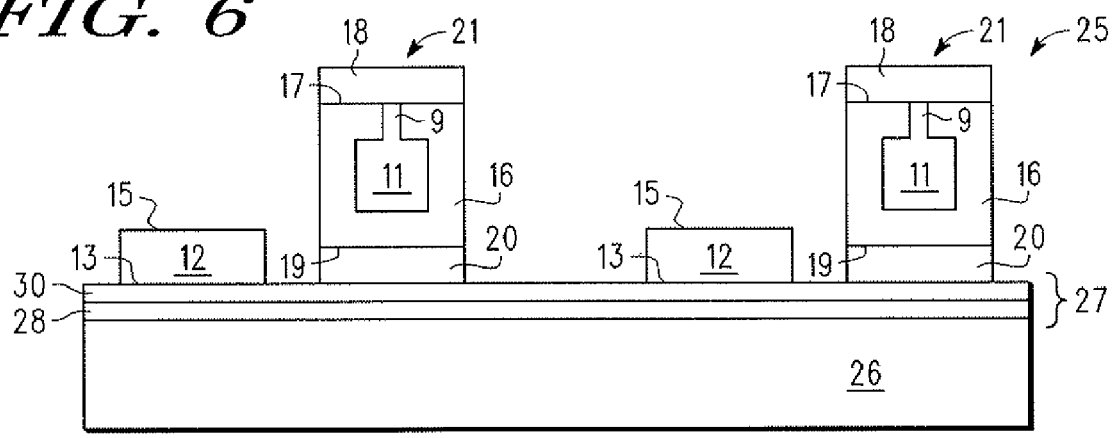
FIG. 6 illustrates the first device and second devices attached to a substrate in accordance with an embodiment.
Figure 7:
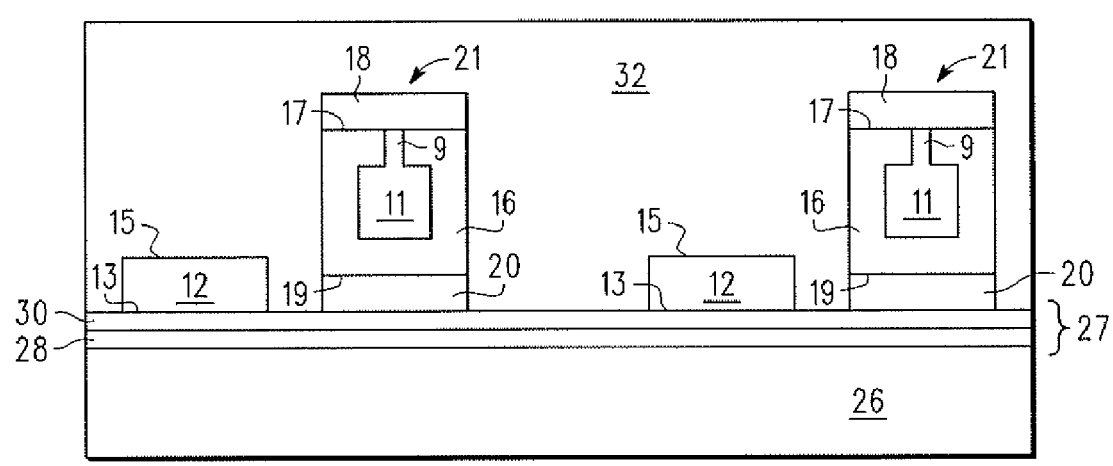
FIG. 7 illustrates the panel of FIG. 6 after encapsulation in accordance with an embodiment.

After the first device array 10 and the second device array 14 are singulated, the first devices 12 and the coated second devices 21 are attached to a substrate 26 to form a panel as illustrated in FIG. 6. In one embodiment, the first surface 13, which in the embodiment illustrated is the active surface (e.g., it is the surface that is coupled to the circuitry), of the first device 12 is placed in contact with the adhesive 27. As illustrated, the second coating 20 of the coated second device 21 is placed in contact with the adhesive. A skilled artisan recognizes that if the second coating 20 was not present than the second surface 190 of the second device 16 would be in contact with the adhesive. In other embodiments, the second surface 15 of the first device 12 is in contact with the adhesive. In other embodiments, the first coating 18 of the coated second device 21 is in contact with the adhesive. In one embodiment, the substrate 26 is a glass plate. In one embodiment, the first devices 12 and the second device 16 are attached using an adhesive 27 which in one embodiment includes a first tape 28 and a second tape 30. The first tape 28 provides good adhesion to the substrate 26 and the second tape 30 provides good adhesion to the first tape 28 and both the first device 12 and the coated second devices 21. For example the first tape 28 may be a double side adhesive tape such as 3M 9731 and the second tape 30 may be a thermally releasable tape known as Rexpan from Haeun Chemtec co., Ltd. of Korea. The adhesive 27 can include a single material or tape that has good adhesion to the substrate 26 and both the first device 12 and the coated second devices 21. Alternatively, other adhesives could be used such as glues, the like and combinations of the above and combinations including tape. As will be better understood after further discussion, the adhesive 27 should be able to keep the devices 12 and 21 attached to be removed during further processing.

After attaching the first devices 12 and the coated second devices 21 to the substrate 26 an encapsulant 32 is formed over the panel 25, and more specifically, formed over the first devices 12 and the coated second devices 21. The encapsulant can be any suitable encapsulant, such as a resin material. In one embodiment, the encapsulant is applied in liquid form. The first coating 18 protects the cavity 11 during the encapsulation process because it acts as a lid or a dam and prevents the encapsulant from entering the cavity 11 through the opening 9. If compression molding is used to encapsulate the first device 12 and the coated second device 21 then the first coating 18 can be a compliant material that seals against the top half of the mold chamber so that the protective coating is not covered. This would eliminate the processing required to remove portions of the encapasulant and expose the first coating 18. After forming an encapsulant, a cure may be performed.

Figure 8:
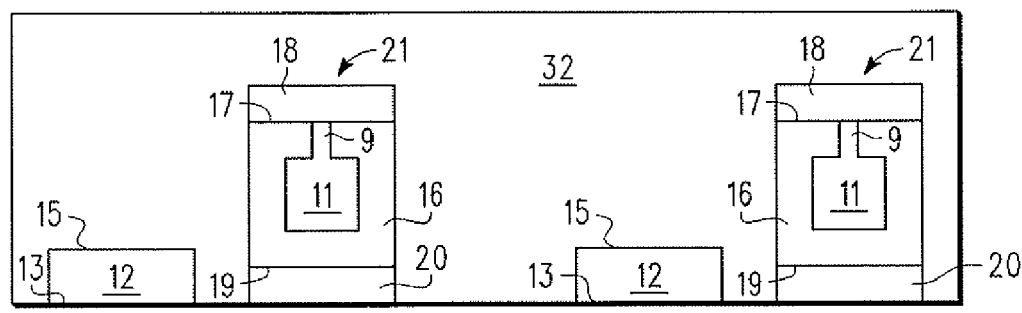
FIG. 8 illustrates the panel of FIG. 7 after releasing the first and second devices from the substrate in accordance with an embodiment.

Next, the encapsulated first devices 12 and coated second devices 21 are released from the substrate 26, as illustrated in FIG. 8. In the embodiment illustrated, where the adhesive 27 includes a first tape 28 and a second tape 30, temperature, light, physical force, the like or combinations of the above is used to release the adhesive 27 from the first device 12 and the coated second device 21. Because the second tape 20 adheres well to the first tape 28 and the substrate 26 only the first tape 28 needs to be released. Hence, the process used can be tailored to release the first tape 28. After releasing the first device 12 and the coated second device 21 from the substrate 26, the first surface of the first device 12 is exposed and the second coating 20, if present, is exposed. If the second coating 20 is not present, then the second surface 19 of the coated second device 21 is exposed.

Figure 9:
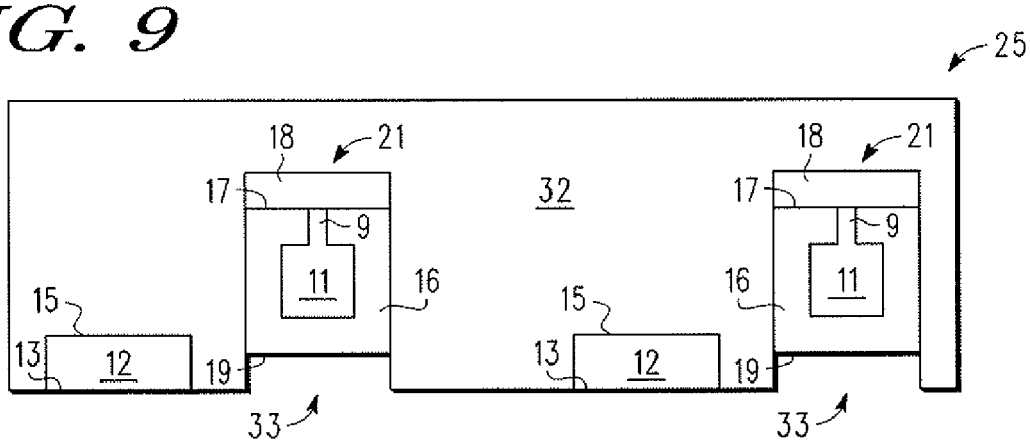
FIG. 9 illustrates the panel of FIG. 8 after the first coating is remove in accordance with an embodiment.

As illustrated in FIG. 9. If the second coating 20 is exposed after releasing the first device and the coated second device 21 from the substrate, the second coating 20 can be removed using physical force or dissolved. For example, in an embodiment where the second coating is AZ 4620 from AZ Electronic Materials Inc of New Jersey, N-methyl-2-pyrrolidone, can be used to remove the second coating 20. After the second coating 20 is removed, the second surface 19 of the coated semiconductor device 21 is exposed and the coated semiconductor device 21 is recessed, as shown by recesses 33, with respect to the first device 12 and the edge of the encapsulant that is coterminous with the first surface 13 of the first device 12. The recesses 33 have dimensions approximately equal to the dimensions of the second coating 20 that was removed. Hence, if the second coating 20 is very thin, the recesses 33 may not be apparent.

Figure 10:
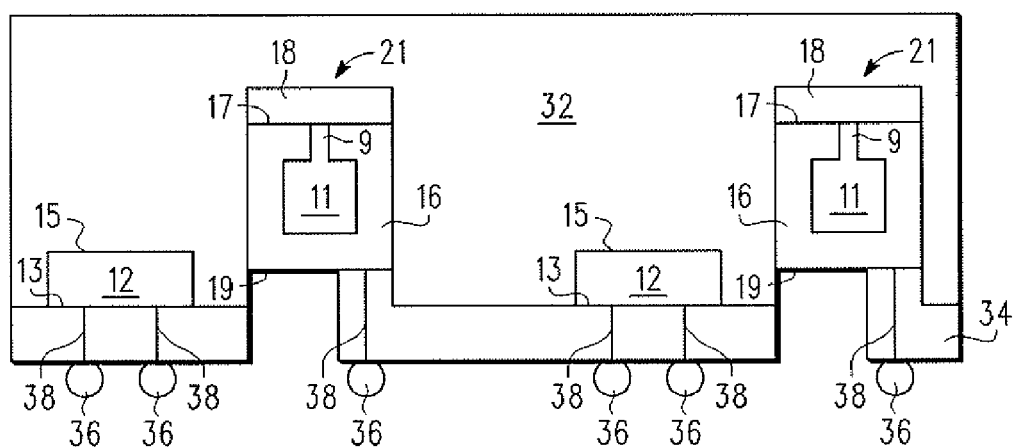
FIG. 10 illustrates the panel of FIG. 9 after forming electrical contacts in accordance with an embodiment.

FIG. 10 illustrates the panel of FIG. 9 after forming electrical contacts 36 in accordance with an embodiment. A dielectric material 34 is formed over the panel 25. In one embodiment, the dielectric material 34 is PC101 from Polysciences of Warrington, Pa. or ZTI-1004, from Zeon Technologies of Charlotte, N.C. Any suitable dielectric material can be used. Vias 38 are then formed in the dielectric material 34 using for example, photolithography to form via holes, which are then filled with a conductive material, such as aluminum. After forming the vias 38, electrical contacts 36 are coupled to the vias 38 and attached to the panel 25. In the embodiment illustrated, the electrical contacts 36 are solder balls. Any desirable solder ball material may be used, such as lead-tin or a lead-free material. The solder balls can be attached using conventional processes, such as applying a solder paste and performing a reflow process to melt the solder paste and physically adhere the solder balls to the panel 25. The electrical contacts 36 and the vias 38 are capable of coupling the first device 12 or the second device16 external devices or products.

Figure 11:
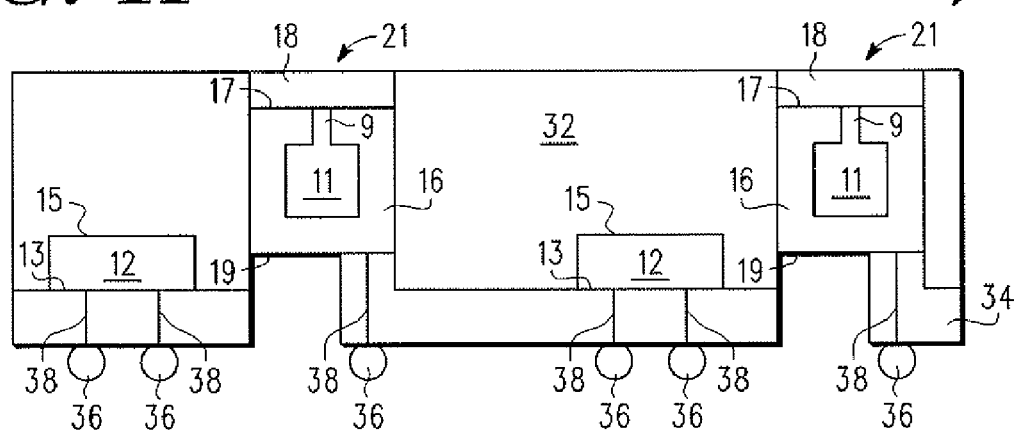
FIG. 11 illustrates the panel of FIG. 10 after removing a portion of the encapsulant in accordance with an embodiment.

After forming the electrical contacts 36, a portion of the encapsulant 32 is removed so that a surface (i.e., top surface) of the encapsulant 32 is coplanar with a top surface of the first coating 18, in the embodiment illustrated in FIG. 11. In other words, a portion of the encapsulant 32 is removed to expose the first coating 18. The portion of the encapsulant 32 can be removed for example by grinding or lapping. In one embodiment, the portion of the encapsulant 32 is removed before forming the electrical contacts 36. In one embodiment, the portion of the encapsulant 32 that is removed is the portion that is above the first coating 18 so that the first coating 18 is not removed. In another embodiment, grinding is used to expose the coating from removal purposes, but does not proceed far enough to completely remove the protective coating and subsequently damage the underlying surface.

Figure 12:
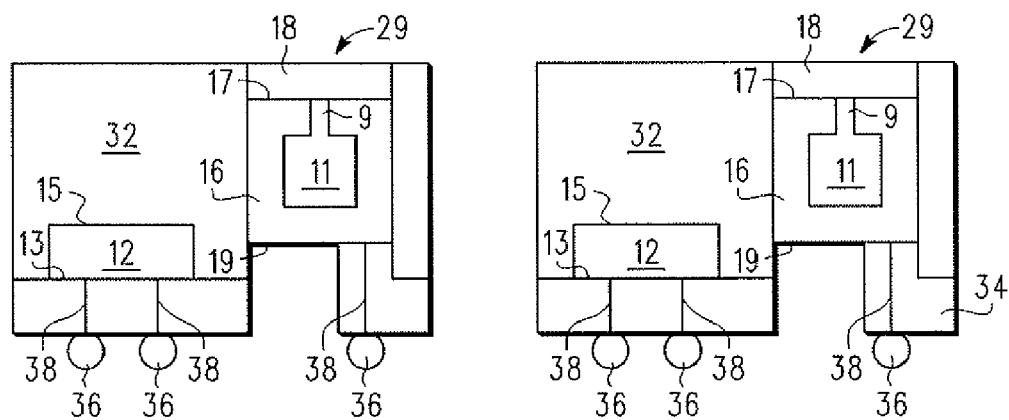
FIG. 12 illustrates the panel of FIG. 11 after singulating the panel into packaged devices in accordance with an embodiment.

In the embodiment illustrated in FIG. 12, after exposing the first coating 18, the panel 25 is singulated into packages 29. In this embodiment, each package 29 includes the first device 12 and the second device 16. Singulation can be performed by laser, sawing, the like, or combinations of the above.

If singulation is performed using liquids, such as by sawing, wherein liquids are needed during the sawing process, the first coating 18 should remain during the singulation process to protect the cavity 11 from the liquid. However, if the singulation process if performed in a manner where the cavity 11 of the second device 16 would not be contaminated (e.g., singulation using a laser), then the first coating 18 may be removed during or simultaneously with the singulation process.

Figure 13:
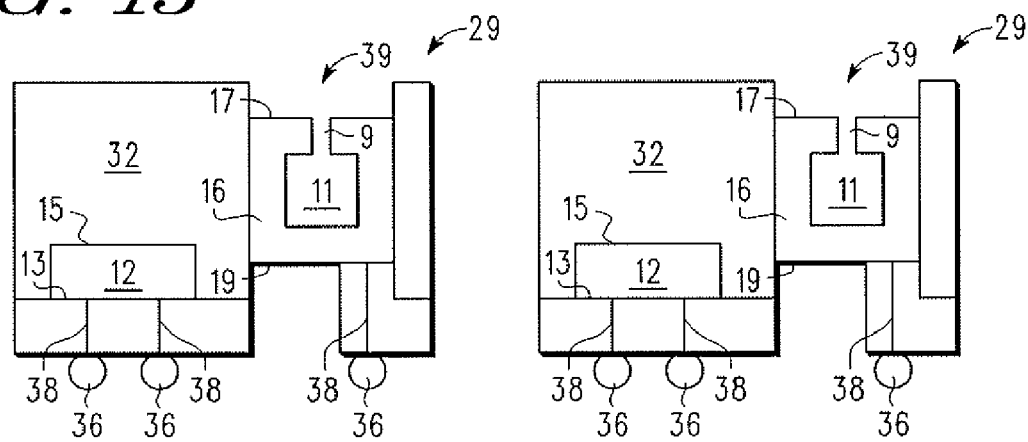
FIG. 13 illustrates the packaged devices of FIG. 12 after removing the second coating in accordance with an embodiment.

If the singulation process of FIG. 12 is performed with the first coating 18 present, the first coating 18 can be removed after singulation, as illustrated in FIG. 13. The first coating 18 can be removed using force, heat, light, or chemicals. If the first coating 18 is a releasable film then an adhesive tape can be applied over the releasable film and peeled together with the releasable film. In another embodiment, the first coating can be removed with a mechanical picker. When the first coating 18 is removed, a recess 39 is formed that has the dimensions approximately equal to those of the first coating 18. Furthermore, when the first coating 18 is removed, the first surface 17 of the second device 16 is exposed along with the second surface 19 of the second device 16, which was exposed during prior processing. If the second device 16 is a pressure sensor, the cavity 11 is now exposed and the opening 9 can be used as a pressure inlet and the second surface 19 can be used as a diaphragm.

By now it should be appreciated that there has been provided methods for making embedded die packages that allow for exposure of portions of a device, such as the front surface of the second device 16 to allow for a cavity to be exposed. As illustrated in FIG. 13, both the first surface and the second surface, which is parallel and opposite the first surface, of a device may be exposed. The methods described can be used to package a device with a cavity without the cavity being filled by encapsulant or harmed during other processes.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention is described herein with reference to specific embodiments, various modifications and changes can be made without departing from the scope of the present invention as set forth in the claims below. For example, any number of devices or components may be in the array. In addition, any number of devices or components may be within the package. The number illustrated is for exemplary purposes only. In addition, the devices may be attached to the substrate 26 in FIG. 6 opposite that illustrated so that the devices are upside down in the package relative to that illustrated in FIG. 13. Under these circumstances, additional vias and interconnects may be needed. In addition, the devices illustrated in the figures are adjacent each other. In some embodiment, the devices may be placed over or in contact with each other. In one embodiment, a semiconductor package includes a first device at a first level in the semiconductor package, wherein the first device includes a first active surface positioned in a first direction; and a second device at a second level, wherein the second device includes a second active surface in a second direction, the first direction is opposite the second direction; and the second level is greater than the first level. In one embodiment, a semiconductor package includes a first device in the semiconductor package, wherein the first device includes a first active surface positioned in a first direction; and a second device over the first device, wherein the second device includes a second active surface in a second direction, the first direction is opposite the second direction, and the second level is greater than the first level. In one embodiment, at least two die are stacked over each other with the non-active side of the die (i.e., the sides without active circuitry) are in contact with each other so that the sides of the die with active circuitry are in opposite directions. The two die may be coupled together through vias within each die. In one embodiment, a cure could be performed prior to encapsulation. In some embodiments, a spacer may be added under or over a device to adjust the height of the device. For example, a spacer can be attached to the second surface of the first device 12 so that first device and the spacer have a combined height approximately equal to that of the coated second device 21 or the combined height of the second device 16 and the second coating 20. In addition, all the devices placed on the substrate 26 may have a coating or multiple coating layers.

Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements. The term "coupled," as used herein, is not intended to be limited to a direct coupling or a mechanical coupling. Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

What is claimed is:

1. A method of forming a semiconductor package, the method comprising:
    forming a first coating over a first surface of a first device;
    attaching the first device to a substrate using an adhesive;
    forming a second coating over a second surface of the first device, wherein the second surface is opposite the first surface
    encapsulating the first device using an encapsulant material;
    releasing the first device from the substrate using the adhesive;
    removing the second coating after releasing the first device from the substrate using the adhesive;
    removing a portion of the encapsulant material that is over the first device to expose the first coating; and
    removing the first coating over the first device to expose a portion of the first device, wherein the removing the first coating is performed after the removing the portion of the encapsulant material.

2. A method of forming a semiconductor package comprising:
- providing an array comprising a plurality of first devices;
- providing a wafer comprising a plurality of second devices;
- applying a first protective layer to a first side of the plurality of first devices;
- applying a second protective layer to a second side of the plurality of first devices wherein the second side is opposite the first side and the second side comprises an active surface;
- singulating the plurality of first devices from the array after the applying the first protective layer and the second protective layer;
- singulating the plurality of second devices from the wafer;
- attaching the plurality of first devices and the plurality of second devices to a substrate using an adhesive to form a panel;
- encapsulating the plurality of first devices and the plurality of second devices with an encapsulant;
- releasing, after encapsulating, the substrate from the plurality of first devices and the plurality of second devices using the adhesive;
- forming terminals coupled to the plurality of first devices and the plurality of second devices;
- singulating the panel to form a plurality of packages, wherein each of the plurality of packages comprises one of the plurality of first devices and one of the plurality of second devices;
- removing the second protective layer from the plurality of first devices after releasing the substrate; and
- removing the first protective layer over the plurality of first devices after releasing the substrate.

3. A method of forming a semiconductor package comprising:
- providing a first array comprising a plurality of first components;
- providing a second array comprising a plurality of second components;
- applying a first coating to a first side of the plurality of first components;
- applying a second coating to a second side of the plurality of first components, wherein the second side is opposite the first side and the second side comprises an active surface;
- singulating the plurality of first components;
- singulating the plurality of second components;
- attaching the plurality of first components and the plurality of second components to a substrate using an adhesive to form a panel, wherein the first side of the plurality of first components are farther from the substrate than the second side of the plurality of first devices;
- encapsulating the plurality of first components and the plurality of second components with an encapsulant;
- releasing, after encapsulating, the substrate from the plurality of first components and the plurality of second components using the adhesive;
- removing the second coating from the plurality of first devices;
- forming terminals coupled to the plurality of first components and the plurality of second devices;
- removing a portion of the encapsulant over the plurality of first devices and the plurality of second devices, wherein removing comprises grinding;
- singulating the panel to form a plurality of packages, wherein each of the plurality of packages comprises one of the plurality of first components and one of the plurality of second devices; and
- removing the first coating over the plurality of first devices after removing the portion of the encapsulant.

4. The method of claim 1, further comprising attaching a second device to the substrate using a release adhesive.

5. The method of claim 1, wherein removing the coating over the first device to expose the portion of the first device comprises removing the coating over the first device to expose a cavity of the first device.

6. The method of claim 1, wherein attaching the first device to the substrate, comprises attaching the first device to a glass substrate.

7. The method of claim 1, wherein removing a portion of the encapsulant material further comprises grinding the encapsulant material.

8. The method of claim 4, wherein attaching the first device occurs after attaching the second device.

9. The method of claim 8, wherein attaching the first device to the substrate further comprises placing the first device laterally adjacent the second device.

10. The method of claim 8, wherein attaching the first device to the substrate further comprises placing the first device over the second device.

11. The method of claim 2, further comprising exposing the first protective layer over the plurality of first devices.

12. The method of claim 2, wherein the plurality of first devices comprises a cavity.

13. The method of claim 11, wherein exposing the first protective layer over the plurality of first devices comprises removing a portion of the encapsulant over the plurality of first devices and the plurality of second devices.

14. The method of claim 13, wherein removing the portion of the encapsulant comprises grinding the encapsulant.

15. The method of claim 12, wherein the plurality of first devices are pressure sensors.

16. The method of claim 3, wherein removing the first coating is performed after singulating the panel.

17. The method of claim 3, wherein removing the first coating is performed before singulating the panel.

* * * * *